(12) United States Patent
King et al.

(10) Patent No.: US 6,479,862 B1
(45) Date of Patent: Nov. 12, 2002

(54) CHARGE TRAPPING DEVICE AND METHOD FOR IMPLEMENTING A TRANSISTOR HAVING A NEGATIVE DIFFERENTIAL RESISTANCE MODE

(75) Inventors: Tsu-Jae King, Fremont, CA (US); David K. Y. Liu, Fremont, CA (US)

(73) Assignee: Progressant Technologies, Inc., Fremont, CA (US)

( * ) Notice: Subject to any disclaimer, the term of this patent is extended or adjusted under 35 U.S.C. 154(b) by 2 days.

(21) Appl. No.: 09/603,102

(22) Filed: Jun. 22, 2000

(51) Int. Cl.[7] .............................................. H01L 29/72
(52) U.S. Cl. ..................... 257/321; 257/295; 257/317; 257/322; 257/324; 257/401; 257/402; 257/405; 257/645
(58) Field of Search ................................ 257/295, 401, 257/402, 317, 321, 322, 324, 405, 645

(56) References Cited

U.S. PATENT DOCUMENTS

| | | | |
|---|---|---|---|
| 4,047,974 A | 9/1977 | Harari | 148/1.5 |
| 4,143,393 A | 3/1979 | DiMaria et al. | 357/52 |
| 4,806,998 A | 2/1989 | Vinter et al. | 357/22 |
| 4,945,393 A | 7/1990 | Beltram et al. | 357/23.5 |
| 5,021,841 A | 6/1991 | Leburton et al. | 357/22 |
| 5,130,763 A | 7/1992 | Delhaye et al. | 357/22 |
| 5,162,880 A | 11/1992 | Hazama | 257/106 |
| 5,189,499 A | 2/1993 | Izumi et al. | 257/215 |
| 5,357,134 A | 10/1994 | Shimoji | 257/325 |
| 5,390,145 A | 2/1995 | Nakasha et al. | 365/159 |
| 5,477,169 A | 12/1995 | Shen et al. | 326/55 |
| 5,543,652 A | 8/1996 | Ikeda et al. | 257/377 |
| 5,606,177 A | 2/1997 | Wallace et al. | 257/25 |
| 5,633,178 A * | 5/1997 | Kalnitsky | 257/410 |
| 5,689,458 A | 11/1997 | Kuriyama | 365/159 |
| 5,705,827 A | 1/1998 | Baba et al. | 257/46 |
| 5,770,958 A | 6/1998 | Arai et al. | 327/114 |
| 5,773,996 A | 6/1998 | Takao | 326/135 |
| 5,804,475 A | 9/1998 | Meyer et al. | 438/172 |
| 5,883,549 A | 3/1999 | De Los Santos | 331/107 |
| 5,883,829 A | 3/1999 | Van der Wagt | 365/159 |
| 5,895,934 A | 4/1999 | Harvey et al. | 257/49 |
| 5,903,170 A | 5/1999 | Kulkarni et al. | 326/134 |
| 5,959,328 A | 9/1999 | Krautschneider et al. | 257/314 |
| 5,962,864 A | 10/1999 | Leadbeater et al. | 257/25 |
| 6,015,978 A | 1/2000 | Yuki et al. | 257/25 |
| 6,077,760 A | 6/2000 | Fang et al. | 438/492 |
| 6,091,077 A | 7/2000 | Morita et al. | 257/25 |
| 6,104,631 A | 8/2000 | El-Sharaway et al. | 365/154 |

FOREIGN PATENT DOCUMENTS

| | | |
|---|---|---|
| WO | 9963598 | 12/1999 |
| WO | 0041309 | 7/2000 |

OTHER PUBLICATIONS

Alejandro F. Gonzalez, et al., "Standard CMOS Implementation of a Multiple–Valued Logic Signed–Digit Adder Based on Negative Differential–Resistance Devices," *Proceedings of the 30th IEEE International Symposium on Multiple–Valued Logic (ISMVL 2000)*, 6 pages.

(List continued on next page.)

*Primary Examiner*—Edward Wojciechowicz
(74) *Attorney, Agent, or Firm*—J. Nichols Gross

(57) ABSTRACT

A charge trapping structure for use with an n-channel metal-insulator-semiconductor field-effect transistor (MISFET) is disclosed. A dielectric layer is formed close to a channel region of the MISFET, and includes a number of trapping sites which are arranged and have a concentration sufficient to temporarily store energetic electrons induced by an electric field to move from the channel into the trapping sites. The trapped electrons set up a counter field that depletes the channel of carriers, and as a bias voltage across the channel increases, the device exhibits negative differential resistance (NDR). The charge trapping structure, as well as the rest of the device, are formed using conventional CMOS processing techniques.

65 Claims, 4 Drawing Sheets

OTHER PUBLICATIONS

G. Wirth, et al., "Negative Differential Resistance in Ultrashort Bulk MOSFETs," *IECON'99 Conference Proceedings*, vol. 1, San Jose, 1999, S. 29–34.

R. H. Mathews, et al., "A New RTD–FET Logic Family," *Proceedings of the IEEE*, vol. 87, No. 4, pp. 596–605, 1999.

J. P. A. Van Der Wagt, "Tunneling–Based SRAM," *Proceedings of the IEEE*, vol. 87, No. 4, pp. 571–595, 1999.

C. P. Heij, et al., "Negative Differential Resistance Due to Single–Electron Switching," *Applied Physics Letters*, vol. 74, No. 7, Feb. 15, 1999, 5 pages.

S. L. Rommel, et al., "Room Temperature Operation of Epitaxially Grown Si/Si$_{0.5}$Ge$_{0.5}$/Si Resonant Interband Tunneling Diodes," *Applied Physics Letters*, vol. 73, No. 15, pp. 2191–2193, 1998.

News Release from www.eurekalert.org/releases/udel–udc-nflb.html, "UD Computer News: Future Looks Bright for Tunnel Diodes, Promising Faster, More Efficient Circuits," Oct. 1, 1998, 4 pages.

P. Mazumder, et al., "Digital Circuit Applications of Resonant Tunneling Devices," *Proceedings of the IEEE*, vol. 86, No. 4, pp. 664–686, Apr., 1998.

J. P. Sun, et al., "Resonant Tunneling Diodes: Models and Properties," *Proceedings of the IEEE*, vol. 86, No. 4, Apr. 1998, pp. 641–661.

R. Oberhuber, et al., "Tunnel–Devices with Negative Differential Resistivity Based on Silicon?," Source: *Deutsche Forschungsgemeinschaft and Siemens AG*, date unknown, 2 pages.

J. P. A. Van Der Wagt, et al., "RTD/HFET Low Standby Power SRAM Gain Cell," Source: *Corporate Research Laboratories, Texas Instruments*, 1998, 4 pages.

G. I. Haddad et al., "Tunneling Devices and Applications in High Functionality/Speed Digital Circuits," *Solid State Electronics*, vol. 41, No. 10, Oct. 1997, pp. 1515–1524.

S. J. Koester, et al., "Negative Differential Conductance in Lateral Double–Barrier Transistors Fabricated in Strained Si Quantum Wells," *Applied Physics Letters*, vol. 70, No. 18, May, 1997, pp. 2422–2424.

E. Chan, et al., "Mask Programmable Multi–Valued Logic Gate Arrays Using RTDs and HBTs," *IEE Proceedings—E: Computers and Digital Techniques*, vol. 143, No. 5, Oct. 1996, pp. 289–294.

E. Chan, et al., "Compact Multiple–Valued Multiplexers Using Negative Differential Resistance Devices," *IEEE Journal of Solid–State Circuits*, vol. 31, No. 8, Aug. 1996, pp. 1151–1156.

S. Mohan, et al., "Ultrafast Pipelined Arithmetic Using Quantum Electronic Devices," *IEE Proceedings—E: Computers and Digital Techniques*, vol. 141, No. 2, Mar. 1994, pp. 104–110.

S. Mohan, et al., "Logic Design Based on Negative Differential Resistance Characteristics of Quantum Electronic Devices," *IEE Proceedings—G: Electronic Devices*, vol. 140, No. 6, Dec. 1993, pp. 383–391.

S. Mohan, et al., "Ultrafast Pipelined Adders Using Resonant Tunneling Transistors," *IEE Electronics Letters*, vol. 27, No. 10, May 1991, pp. 830–831.

O. Le Neel, et al., "Electrical Transient Study of Negative Resistance in SOI MOS Transistors", *Electronics Letters*, vol. 26, No. 1, pp. 73–74, Jan. 1990.

P. S. Barlow, et al., "Negative differential output conductance of self–heated power MOSFETs", *IEE Proceedings—I Solid–State and Electron Devices*, vol. 133, Part I, No. 5, Oct. 1986, pp 177–179.

Serge Luryi and Mark Pinto, "Collector–Controlled States in Charge Injection Transistors," *SPIE–92 Symposium*, pp. 1–12, (1992).

Serge Luryi and Mark Pinto, "Collector–Controlled States and the Formation of Hot Electron Domains in Real–Space Transfer Transistors," *AT&T Bell Laboratories*, pp. 1–7, (1992).

S. Luryi and M. Mastrapasqua, "Light–emitting Logic Devices based on Real Space Transfer in Complementary InGaAs/InAlAs Heterostructures", in "*Negative Differential Resistance and Instabilities in 2D Semiconductors*", ed. by N. Balkan, B. K. Ridley, and A. J. Vickers, NATO ASI Series [Physics] B 307, pp. 53–82, Plenum Press (New York 1993).

Shao, Z., Porod, W., Lent, C., & Kirkner, D., "Transmission Zero Engineering in Lateral Double–Barrier Resonant Tunneling Devices," Dept. Of Electrical Engineering, University of Notre Dame, pp. 1–7 (1996).

C. Pacha and K. Goser, "Design of Arithmetic Circuits using Resonant Tunneling Diodes and Threshold Logic," Lehrstuhl Bauelemente der Elektrotechnik, Universitat Dortmund, pp. 1–11, Sep. 1997.

Jungel, A, Pohl, C., "Numerical Simulation of Semiconductor Devices: Energy–Transport and Quantum Hydrodynamic Modelling," Fachbereich Math., Tech. Univ. Berlin, Germany, pp. 1–9, 1998.

S.M.A. Nimour, R. Ouasti, N. Zekri, "Effect of Spatially Disordered Barriers on the Band Structure of Finite Superlattices," *phys. stat. sol. (b)* 1998, 209, No. 2, 311–318.

C. Pacha, et al. "Resonant Tunneling Device Logic Circuits," Microelectronics Advanced Research Initiative (MELARI,) Jul. 1998–Jul. 1999, pp. 1–22.

Gardner, Carl, Ringhofer, Christian, "Smooth Quantum Hydrodynamic Model Simulation of the Resonant Tunneling Diode," Dept. Of Mathematics Arizona State University, pp. 1–5, (1998).

Seabaugh A., Brar B., Broekaert T., Morris F., and Frazier G., "Resonant Tunneling Mixed Signal Circuit Technology," Solid–State Electronics 43:1355–1365, 1999.

Farid Nemati et al., "A Novel High Density, Low Voltage SRAM Cell With a Vertical NDR Device," Center for Integrated Systems, Stanford University, CA, (2 pages).

Farid Nemati et al., "A Novel Thyristor–based SRAM Cell (T–RAM) for High–Speed, Low–Voltage, Giga–scale Memories," Center for Integrated Systems, Stanford University, CA, (4 pages).

Shoucair F. et al., "Analysis and Simulation of Simple Transistor Structures Exhibiting Negative Differential Resistance," EECS Department, UC Berkeley, Berkeley CA, (4 pages).

* cited by examiner

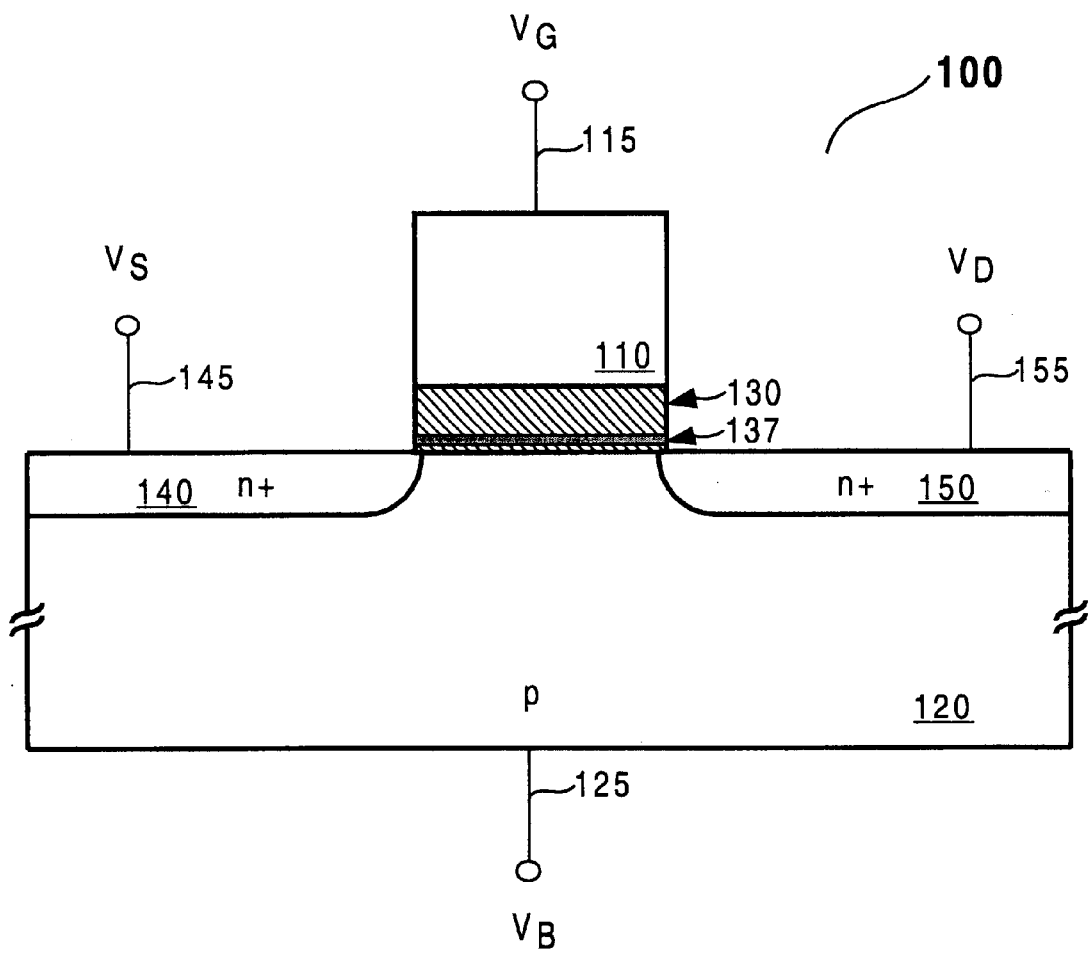

Fig. 4

| Standard CMOS Starting Material |
|---|
| Standard CMOS Isolation Process |
| NDR Surface Doping Process Sequence |
| NDR Device Gate Insulator Formation |
| N-well Dopant Process Sequence (for PMOS) |
| P-well Dopant Process Sequence (For NMOS) |
| Logic Device Gate Oxidation |
| Gate Material Deposition and Patterning |
| NDR Drain Junction Engineering Sequence |
| Source/Drain Pattern and Process Sequence |
| Oxide Deposition |
| Contact Process Sequence |
| Metal Process Sequence |

CHARGE TRAPPING DEVICE AND METHOD FOR IMPLEMENTING A TRANSISTOR HAVING A NEGATIVE DIFFERENTIAL RESISTANCE MODE

FIELD OF THE INVENTION

This invention relates to semiconductor devices and more particularly to a structures and devices that enable a transistor to operate with a negative differential resistance mode. The present invention is applicable to a wide range of semiconductor integrated circuits, particularly for high-density memory and logic applications, as well as power management.

BACKGROUND OF THE INVENTION

Devices that exhibit a negative differential resistance (NDR) characteristic, such that two stable voltage states exist for a given current level, have long been sought after in the history of semiconductor devices. When Nobel Prize winner Leo Esaki discovered the NDR characteristic in a resonant tunneling diode (RTD), the industry looked expectantly to the implementation of faster and more efficient circuits using these devices. NDR based devices and principles are discussed in a number of references, including the following that are hereby incorporated by reference and identified by bracketed numbers [ ] where appropriate below:

[1] P. Mazumder, S. Kulkarni, M. Bhattacharya, J. P. Sun and G. I. Haddad, "Digital Circuit Applications of Resonant Tunneling Devices," *Proceedings of the IEEE*, Vol. 86, No. 4, pp. 664–686, 1998.

[2] W. Takao, U.S. Pat. No. 5,773,996, "Multiple-valued logic circuit" (issued Jun. 30, 1998).

[3] Y. Nakasha and Y. Watanabe, U.S. Pat. No. 5,390,145, "Resonance tunnel diode memory" (issued Feb. 14, 1995).

[4] J. P. A. Van Der Wagt, "Tunneling-Based SRAM," *Proceedings of the IEEE*, Vol. 87, No. 4, pp. 571–595, 1999.

[5] R. H. Mathews, J. P. Sage, T. C. L. G. Sollner, S. D. Calawa, C.-L. Chen, L. J. Mahoney, P. A. Maki and K. M Molvar, "A New RTD-FET Logic Family," *Proceedings of the IEEE*, Vol. 87, No. 4, pp. 596–605, 1999.

[6] H. J. De Los Santos, U.S. Pat. No. 5,883,549, "Bipolar junction transistor (BJT)—resonant tunneling diode (RTD) oscillator circuit and method (issued Mar. 16, 1999).

[7] S. L. Rommel, T. E. Dillon, M. W. Dashiell, H. Feng, J. Kolodzey, P. R. Berger, P. E. Thompson, K. D. Hobart, R. Lake, A. C. Seabaugh, G. Klimeck and D. K. Blanks, "Room temperature operation of epitaxially grown $Si/Si_{0.5}Ge_{0.5}/Si$ resonant interband tunneling diodes," *Applied Physics Letters*, Vol. 73, No. 15, pp. 2191–2193, 1998.

[8] S. J. Koester, K. Ismail, K. Y. Lee and J. 0. Chu, "Negative differential conductance in lateral double-barrier transistors fabricated in strained Si quantum wells," *Applied Physics Letters*, Vol. 70, No. 18, pp. 2422–2424, 1997.

[9] G. I. Haddad, U. K. Reddy, J. P. Sun and R. K. Mains, "The bound-state resonant tunneling transistor (BSRTT): Fabrication, d.c. I–V characteristics, and high-frequency properties," *Superlattices and Microstructures*, Vol. 7, No. 4, p. 369, 1990.

[10] Kulkarni et. al., U.S. Pat. No. 5,903,170, "Digital Logic Design Using Negative Differential Resistance Diodes and Field-Effect Transistors (issued May 11, 1999).

A wide range of circuit applications for NDR devices are proposed in the above references, including multi-valued logic circuits [1,2], static memory (SRAM) cells [3,4], latches [5], and oscillators [6]. To date, technological obstacles have hindered the widespread use of RTD devices in conventional silicon-based integrated circuits (ICs), however.

The most significant obstacle to large-scale commercialization has been the technological challenge of integrating high-performance NDR devices into a conventional IC fabrication process. The majority of RTD-based circuits require the use of transistors, so the monolithic integration of NDR devices with predominant complementary metal-oxide-semiconductor (CMOS) transistors is the ultimate goal for boosting circuit functionality and/or speed. Clearly, the development of a CMOS-compatible NDR device technology would constitute a break-through advancement in silicon-based IC technology. The integration of NDR devices with CMOS devices would provide a number of benefits including at least the following for logic and memory circuits:

1) reduced circuit complexity for implementing a given function;
2) lower-power operation; and
3) higher-speed operation.

Significant manufacturing cost savings could be achieved concomitantly, because more chips could be fabricated on a single silicon wafer without a significant increase in wafer-processing cost. Furthermore, a CMOS compatible NDR device could also be greatly utilized in power management circuitry for ICs, which is an area of growing importance due to the proliferation of portable electronic devices (PDAs, cell phones, etc.).

A tremendous amount of effort has been expended over the past several decades to research and develop silicon-based NDR devices in order to achieve compatibility with mainstream CMOS technology, because of the promise such devices hold for increasing IC performance and functionality. Efforts thus far have only yielded quantum-mechanical-tunneling-based devices that require either prohibitively expensive process technology or extremely low operating temperatures which are impractical for high-volume applications. One such example in the prior art requires deposition of alternating layers of silicon and silicon-germanium alloy materials using molecular beam epitaxy (MBE) to achieve monolayer precision to fabricate the NDR device [7]. MBE is an expensive process which cannot be practically employed for high-volume production of semiconductor devices. Another example in the prior art requires the operation of a device at extremely low temperatures (1.4 K) in order to achieve significant NDR characteristics [8]. This is impractical to implement for high-volume consumer electronics applications.

A further drawback of the tunnel diode is that it is inherently a two-terminal device. Three (or more) terminal devices are preferred as switching devices, because they allow for the conductivity between two terminals to be controlled by a voltage or current applied to a third terminal, an attractive feature for circuit design as it allows an extra degree of freedom and control in circuit designs. Three-terminal quantum devices which exhibit NDR characteristics such as the resonant tunneling transistor (RTT) [9] have been demonstrated; the performance of these devices has also been limited due to difficulties in fabrication, however. Some bipolar devices (such as SCRs) also can exhibit an NDR effect, but this is limited to embodiments where the effect is achieved with two different current levels. In other words, the I–V curve of this type of device is not extremely useful because it does not have two stable voltage states for a given current.

Accordingly, there exists a significant need for a new three-terminal NDR device which can be easily and reliably implemented in a conventional CMOS technology. In addition, it is further desirable that such a three-terminal device can be operated at room temperature.

One useful observation made by the inventors concerning an ideal NDR device is to notice that its I–V curve looks essentially like that of a non-volatile memory cell that has a dynamic and reversible threshold voltage. The inventors thus noted that if a non-volatile memory could be controlled in this fashion, it might be possible to achieve an NDR effect. To date, however, the inventors are unaware of anyone succeeding with or even attempting such an approach. For example, in a prior art device described in U.S. Pat. No. 5,633,178, and incorporated by reference herein, a type of volatile memory device is depicted, in which electrons are stored in charge traps near a substrate/dielectric layer interface. Notably, this reference discusses the filling and emptying of the traps through programming operations (to store a 0 or 1), but does not identify any implementation or variation that is suitable for an NDR application, or which even suggests that it is capable of dynamic or quickly reversible threshold voltage operation. Similar prior art references also identify the use of charge traps for non-volatile memories, but none again apparently recognize the potential use for such structures in an NDR context. See, e.g., U.S. Pat. Nos. 4,047,974; 4,143,393; 5,162,880 and 5,357,134 incorporated by reference herein.

SUMMARY OF THE INVENTION

An object of the present invention is to provide a new type of semiconductor device, which like the tunnel diode, exhibits a negative differential resistance (NDR) characteristic that can be utilized to dramatically improve the performance and functionality of integrated circuits;

Another object of the present invention is to provide a new NDR device in which band-to-band tunneling is not the sole physical mechanism responsible for the negative differential resistance characteristic;

Another object of the present invention is to provide a new device in which charge trapping can be used for achieving a negative differential resistance characteristic;

Yet another object of the present invention is to provide a new NDR device with full transistor features (i.e., a three-terminal device), where the conductivity between two terminals is controlled by a voltage or current applied to the third terminal;

Yet another object of the present invention is to provide a new NDR device which can be fabricated with a process that is fully compatible with conventional CMOS process technology;

Yet another object of the present invention is to provide a new NDR device whose lateral dimensions can scale in proportion with the scaling of CMOS devices;

Yet another object of the present invention is provide a new NDR device where the voltage corresponding to the onset of negative differential resistance is fully tunable;

Yet another object of the present invention is to provide a new device where the peak current as well as the negative differential resistance between two terminals can be tailored by adjusting the voltage applied to a third terminal;

Finally, another object of the present invention is to provide a device that will be useful for power management applications in portable electronic devices, including as a voltage regulator, an overcurrent protection device, etc.

These and other objects are achieved by the present invention that discloses a new NDR transistor that can be implemented using conventional integrated-circuit process technology. The new device offers significant advantages over prior art: an electronically tunable NDR; extremely high peak-to-valley current ratio (greater than 1000 for room-temperature operation); compatibility with conventional CMOS process technology; and scalability to future generations of CMOS integrated-circuit technology.

A first aspect of the invention concerns a semiconductor transistor device that achieves a negative differential resistance mode by using a dynamically variable and reversible threshold voltage. The threshold voltage can be dynamically controlled using a conventional gate control signal. Unlike prior art devices, the negative differential resistance is based on temporary charge trapping/detrapping mechanism, and not on a band-to-band tunneling mechanism.

Another aspect of the invention pertains to a semiconductor transistor device which has three control terminals, and is operable with a negative differential resistance mode by applying a bias signal across two of the terminals to set up a current path between the two terminals, and a control signal to a separate third terminal for controlling conduction in the current path by controlling a density of charge carriers available in the current path.

Another aspect of the invention concerns a single charge carrier semiconductor device which is operable with a negative differential resistance mode as noted above with two stable voltage states, and is fabricated using only complementary metal oxide semiconductor (CMOS) processing.

A further aspect of the invention pertains to a dielectric trapping layer located proximate to a transistor channel. The transistor channel is capable of carrying a current that varies from a first current value associated with a conducting condition for the transistor channel, to a second current value associated with a non-conducting condition for the transistor channel channel, the second current value being substantially less than the first current value. A plurality of carrier trapping sites within the dielectric layer are configured for trapping carriers that are electrically biased by an electrical control field to move from the channel into the dielectric layer. A negative differential resistance mode can be caused in the channel by rapid trapping and de-trapping of electrons to and from the charge trapping sites.

The trapping sites have a concentration and arrangement within the dielectric layer so that the current in the transistor channel can be varied between the first current value and the second current value by the action of the trapping sites adjusting the current in accordance with a value of the electrical control field, and such that the transistor channel exhibits negative differential resistance. This is due to the fact that a field generated by the carriers stored in the trapping layer can be adjusted to be sufficiently large so as to cause the channel to be depleted of carriers, thus reducing the current in the channel even as the channel bias voltage is increased, and dynamically increasing a threshold voltage of an associated FET.

Other more detailed aspects of the trapping layer and trapping sites include the fact that the trapping sites are located very close (within 1.5 nm preferably) to the channel/trapping layer interface. Furthermore, the trapping and detrapping time of the electrical charges can be controlled through the placement and concentration of the trapping sites. In this fashion, a device can exhibit anything from very short/temporary storage times to very long storage times so that a useful substitute can be realized for a non-volatile floating gate type structure. This type of embedded, spatially distributed electrode of the present invention can exhibit substantial operating advantages over conventional single layer, continuous type electrodes commonly used in non-volatile memories.

Another aspect of the invention relates to the fact that the trapping layer is used in connection with a FET so that in a first operating region for the FET the source-drain current has a value that increases as the lateral electrical field between the source and drain increases, and in a second operating region for the semiconductor device the source-drain current has a value that decreases as the electrical field increases. Accordingly the drain region and the gate are controlled so that the device constitutes a three terminal device that can be operated in a range that exhibits negative differential resistance, because the charge trapping sites in the gate dielectric serve to trap electrons, causing the FET threshold voltage to increase dynamically, thereby reducing an output current of the FET as a drain-to-source voltage difference is increased. The trapping and de-trapping actions are also controlled so that they do not occur primarily near a drain junction of the FET. Other more detailed features of this aspect of the invention include the fact that the drain dopant concentration profile is tailored to minimize impact ionization current between the drain region and the channel region as well as to minimize junction capacitance between the drain region and the semiconductor substrate.

Other more detailed features of this aspect of the invention include the fact that the trapping layer is formed as an integral part of a gate dielectric for the FET which includes one or more of the following materials: silicon-dioxide, silicon-nitride, and/or silicon-oxynitride, and/or a high-permittivity layer with a relative permittivity greater than approximately eight (8). Furthermore, this gate dielectric has a thickness adapted to minimize loss of trapped charge due to quantum-mechanical tunneling. When the gate dielectric is silicon-dioxide it can be formed either entirely or partially by thermal oxidation of heavily doped ($>10^{18}$ cm$^{-3}$) p-type silicon. The charge trapping sites thus consist of defects within the silicon-dioxide formed by thermal oxidation of the doped p-type silicon. Alternatively, the charge trapping sites can consist of islands of metal or semiconductor material, or even a floating gate embedded in the gate dielectric.

In other variations, the trapping layer/gate dielectric consists of a plurality of dielectric layers. In such embodiments, the charge trapping sites can consist of defects located near an interface between adjacent layers of the gate dielectric.

Another aspect of the invention pertains to the fact that the channel can be subjected to an electrical field having a first field component along the surface resulting from a bias voltage applied to the source and drain regions, and a second field component substantially perpendicular to the surface resulting from a control voltage applied to the control gate. These field components control how carriers in the channel acquire sufficient energy to overcome an interface barrier between the channel and the trapping layer, and how quickly they are trapped and detrapped.

Other more detailed aspects of the invention pertaining to the channel characteristics include the fact that the energetic ("hot") carriers are generated (and thus trapped) substantially uniformly throughout a length of the channel region, instead of being concentrated at a junction interface as occurs in the prior art. The channel is also heavily p-type doped, and has a dopant concentration that peaks near the semiconductor surface, to enhance the generation of hot electrons. Furthermore, it can be offset from the source and drain regions to minimize junction capacitance.

Other aspects of the present invention relate to methods of operating the devices described above.

Finally, other aspects of the present invention relate to methods of making the structures and devices above. These include manufacturing processes which are compatible with conventional CMOS techniques used in commercial semiconductor facilities, thus providing a substantial advantage over the prior art. An additional benefit lies in the fact that the onset point for the negative differential resistance mode can be adjusted during the making of the device.

BRIEF DESCRIPTION OF THE DRAWINGS

FIG. 3 is the schematic cross-sectional view of another embodiment of the NDR-MISFET disclosed in this invention.

FIG. 4 is an illustrative process sequence for integrating the NDR-MISFET into a conventional CMOS logic process flow.

DETAILED DESCRIPTION OF PREFERRED EMBODIMENTS

Figure 1:
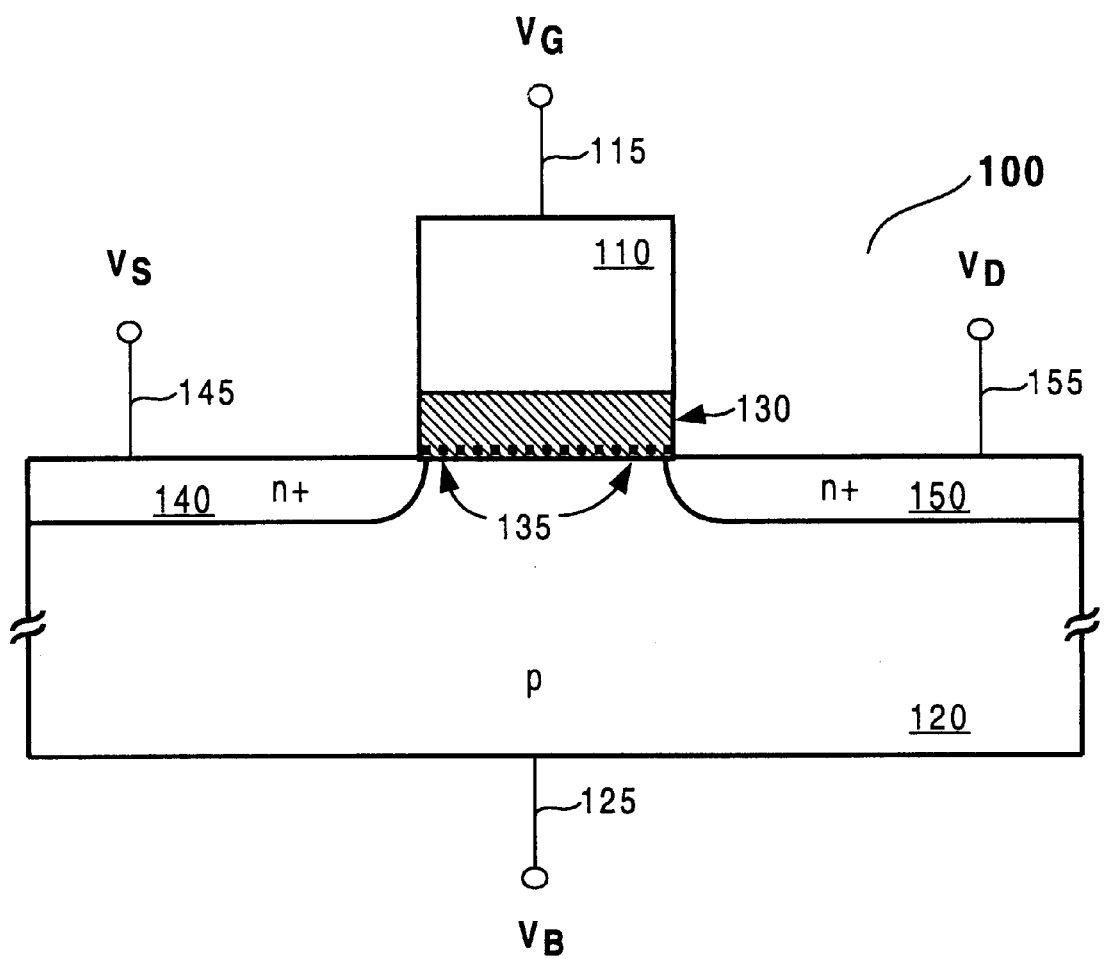
FIG. 1 is the schematic cross-sectional view of an embodiment of the NDR metal-insulator-semiconductor field-effect transistor (MISFET) disclosed in this invention.

The following detailed description is meant to be illustrative only of particular embodiments of the invention. Other embodiments of the invention and variations of those disclosed will be obvious to those skilled in the art in view of the following description.

As discussed below, a preferred device embodiment is described first. Next, the mechanism responsible for the negative differential resistance (NDR) mode is described, followed by additional preferred embodiments for enhancing the performance of an NDR device. Finally, an exemplary method of fabrication will be described.

In accordance with a preferred embodiment of the invention, an n-channel MISFET NDR device structure (FIG. 1) 100 is provided which is made with minimum modification to a standard CMOS process. In fact, from a first glance, device 100 appears to be an ordinary n-channel MOS (NMOS) transistor, in which a gate electrode 110 of the device is formed on top of a semiconductor substrate 120 and electrically insulated from the substrate by a dielectric layer 130. Right away it can be seen that NDR device 100 in this invention is distinctly different from NDR devices in the prior art.

Prior-art NDR devices are typically two-terminal diode devices, made with very complicated and expensive process sequences which are incompatible with a conventional CMOS process. Although NDR device 100 in this invention is similar in appearance to an NMOS transistor, it incorporates slight but critical modifications, as taught in this invention, in order for the device to manifest the desired NDR output characteristic mode.

A first modification is that a p-type dopant concentration in a surface region of the semiconductor substrate underneath the gate electrode (the channel) is relatively high compared to a contemporary conventionally processed n-channel device. In a preferred embodiment of device 100, the p-type dopant concentration is greater than $1\times10^{18}$ cm$^{-3}$ in the channel. Of course, it will be understood that for any particular design rule, device characteristic and process environment the p-type dopant concentration may be varied accordingly, and that some routine design, simulation and/or testing may be necessary to optimize the performance of the device in any particular application. Accordingly, the present invention is not limited to any particular concentration, but, instead, is guided more by considerations of whether a sufficient dopant concentration has been introduced to help contribute to the NDR effect. More heavily doped n-type regions in the semiconductor surface region, adjacent to the channel and located at each end of the gate electrode, form the source and drain contact regions 140 and 150 respectively. The electric potential of the channel can be further adjusted via a body contact terminal 125.

A second modification of present device 100 over a conventional transistor is the fact that charge traps or storage nodes 135 exist in insulating layer 130 between semiconductor substrate 120 and gate electrode 110. These charge traps are located relatively close to (within 1.5 nm of) semiconductor-insulator interface 138, so that charges from semiconductor 120 can be trapped and de-trapped very quickly. Again it will be understood that this distance figure is based on the details of the present embodiment, and that for any particular environment this parameter may vary significantly, so the present invention is not limited by the particular details of the same. The key point, of course, is the existence of these charge traps, or some other physical feature that acts to store electrons. It will be understood of course that the drawing of FIG. 1 is merely an illustration to better describe the features of the present invention, and thus the arrangement and location of the trapping sites 135 is not drawn to scale. A third modification is that insulating layer 130 between semiconductor substrate 120 and gate electrode 110 is relatively thick (greater than 6 nm) to prevent significant loss of trapped charge to the gate electrode via tunneling. Those skilled in the art will again appreciate that this thickness is again a function of the particular material, processing environment, etc., and that the present invention is by no means limited to such figure.

Figure 2:
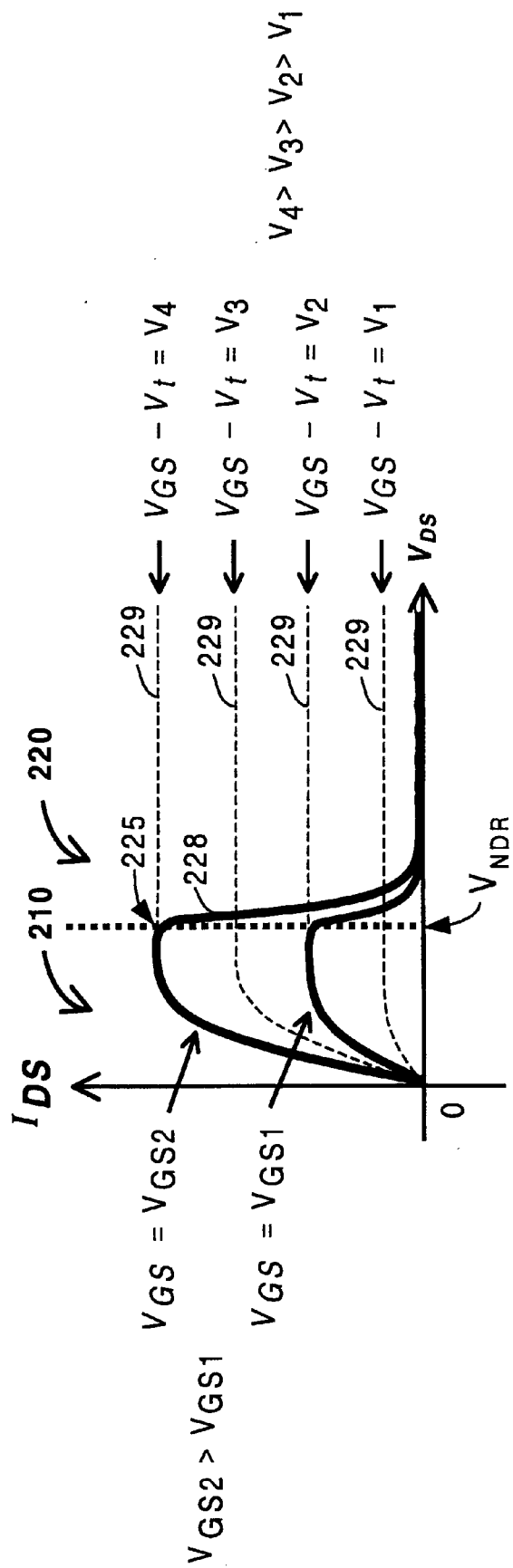
FIG. 2 is a graphical chart illustrating the current versus voltage (I–V) characteristics of the NDR-MISFET, including an NDR operating region.

With source and body terminals 145 and 125 of device 100 held at ground potential and gate terminal 115 biased sufficiently high to turn on the device, the output characteristic (drain current as a function of drain voltage) of device 100 will exhibit negative differential resistance over a range of drain voltages. This aspect of the invention is illustrated in FIG. 2, where device drain current versus drain voltage is plotted for two different gate voltages to show how the NDR mode can be affected by a suitable selection of the gate voltage. It can be seen that for a fixed gate voltage $V_{GS}$, drain current IDS firstly increases in a first region 210 with drain voltage $V_{DS}$, similarly to the behavior that is seen in drain current in a conventional NMOS transistor. Surprisingly, however, in region 220, beyond a certain drain voltage level, drain current decreases with further increases in voltage, i.e. the device exhibits an NDR mode with NDR characteristics. The drain voltage at which the drain current begins to decrease (i.e., point 225 where $V_{DS}=V_{NDR}$) is adjustable through suitable selections of channel length, threshold voltage, etc. It should be noted that, due to the relatively high channel dopant concentration and the relatively thick gate dielectric, the threshold voltage of the NDR FET will be significantly higher than that of a conventional MOSFET, so that a larger than typical gate voltage is correspondingly used for the NDR FET. As a result, $V_{GS}>V_{NDR}$ so that the vertical electric field is in the direction such that electrons are attracted towards the gate electrode, enhancing the NDR effect.

This behavior by device 100 of the present invention is rather surprising, and is apparently the result of physical mechanisms that have hitherto not been exploited in this area of semiconductor devices and processing. In the prior art, band-to-band quantum-mechanical tunneling of charged particles (electrons and/or holes) from one side of a diode to the other side is known to be the primary mechanism for NDR in tunneling diodes. In contrast, for device 100 of the present invention, the physical mechanism appears to be rapid trapping of electrons in the gate insulator underneath the gate electrode, near to (within 1.5 nm of) the semiconductor-insulator interface. Referring to the device structure in FIG. 1, when device 100 is biased with a sufficiently high gate voltage such that the channel of the device is in the strong-inversion condition (i.e. when the gate-to-source voltage is greater than the threshold voltage), a current flows between the source and drain terminals 145 and 155 respectively of the device if a small voltage is applied between such terminals. Since the channel is configured to contain a relatively high p-type dopant concentration, a vertical (in the direction perpendicular to the semiconductor surface) electric field in the channel is large (greater than $10^6$ V/cm). As the drain-to-source voltage increases, the lateral (in the direction parallel to the semiconductor surface) electric field increases, so that a composite (horizontal+vertical) electric field exerting force on inversion-layer electrons in the channel increases. Once this composite electric field reaches a certain critical value (which of course will be a function of the doping and geometry of the device) electrons flowing from source 140 to drain 150 will gain sufficient energy between collisions to surmount a semiconductor-insulator interface potential barrier. Since the vertical electric field component attracts the electrons toward gate electrode 110, electrons enter insulator 130 and subsequently are captured by the traps or storage nodes 135 in the insulator. The presence and accumulation of negative charge in insulator 130 dynamically increases a threshold voltage of device 100. In other words, the electrons accumulated in the traps/storage nodes 135 operate to set up a counter field that inhibits the movement of additional electrons into the channel from the source, and reducing an available channel current by reducing a density of electrons in the channel region. Thus, the net effect created by the traps/storage nodes 135 of the present invention is a drastic reduction in the inversion-layer charge density and commensurate reduction in the current flowing between the source and the drain. It can be seen plainly that the amount of net current in the channel that can be affected by the traps is a function of their number, concentration, location, and the bias conditions imposed on device 100, all of which are easily controllable and optimizable for any particular environment, so that the onset conditions, strength and operating region for a negative differential resistance mode can be tailored and customized as needed.

It is noted that the present disclosure teaches that only a single species of energetic carriers (hot electrons) are generated in a channel region and trapped in insulator 130, and both of these phenomena preferably occur in a substantially uniform manner throughout the channel length. This operation, too, is distinctly different from the case for a conventional NMOS transistor, in which hot electrons are generally generated in the depletion region of the drain p-n junction, leading to impact ionization and an avalanche effect resulting in significant numbers of hot holes as well as hot electrons. Typically, this effect is maximized at a gate-to-source voltage which is lower than the drain-to-source voltage (for example, at a gate voltage equal to one half the drain voltage); hence in a conventional device the vertical electric field in the channel near the drain junction attracts hot holes, rather than hot electrons, toward the gate electrode. Clearly, then, this explains why the creation of hot electrons in a conventional NMOS transistor (even if it occurs incidentally) cannot produce the negative differential resistance characteristic as described in this invention. Furthermore it is well known that the injection of hot holes into the gate insulator causes damage, adversely affecting the performance and reliability of the NMOS transistor. In the NDR-MISFET 100 of the present invention, although holes are generated by impact ionization in the channel, they are not injected (or their injection is substantially eliminated to the point where it is negligible from an operational perspective) into gate insulator 130 because the vertical electric field repels holes from gate electrode 110.

As a point of further clarification, the mechanism responsible for the NDR characteristic of the present invention also does not require that NDR MISFET 100 be operating in a conventional "pinch-off" condition, i.e., in which a gate-to-drain voltage is lower than a threshold voltage so that the inversion-layer charge density in the channel adjacent to the drain is zero. In the pinch-off condition, the lateral electric field is non-uniformly distributed in the channel between the source and drain: the electric field increases gradually and linearly with distance away from the source, and then increases exponentially in the depletion region of the drain junction, so that the generation of hot electrons occurs predominantly in the depletion region of the drain junction, resulting in drain avalanche. In contrast, in the present invention, NDR-MISFET 100 is preferably operated in a "triode" region, so that the electric field increases uniformly from the source end of the channel to the drain end. The drain current saturates due to velocity saturation, not pinch-off, so the current does not increase linearly with $V_{DS}$ (as seen generally in FIG.2).

In a preferred embodiment of NDR-MISFET 100, sufficient bias is applied so that the electrons in the channel become so energetic that channel hot electrons are created due to the high composite electric field in the channel. These channel hot electrons have sufficient energy imparted from the horizontal component of this field to surmount the potential barrier at the semiconductor-insulator interface and enter gate insulator 130 because the vertical electric field component attracts them toward gate electrode 110. The electrons are captured by the traps or storage nodes 135 in insulator 130; consequently the threshold voltage of the transistor increases dynamically. More charge is trapped as the drain-to-source voltage increases (for a constant gate voltage), because the generation of hot carriers (and thus the percentage of the current that is based on a hot carrier component) correspondingly increases, and it is these hot carriers that are trapped. As greater numbers of hot carriers are trapped, they increase the threshold voltage and thereby reduce the mobile charge density in the channel by a disproportionate amount (compared to the hot-carrier current charge amount), thus decreasing the drain current dramatically. This results in the negative differential resistance in the output (drain current versus drain voltage) characteristic. It can be seen also that more charge can be trapped by increasing the vertical component of the field as well, since this increases the likelihood that a charged carrier will be forced into a trap 135 in dielectric layer 130 (the trapping rate), and also increases a temporary storage/trapping time associated with the charge. It is not necessary, nonetheless, to trap a significant number of carriers, because even a small quantity stored in the trapping sites can be sufficient to deplete the channel of mobile carriers. It is also preferable to not increase the vertical field to the point where some deleterious side effects (dielectric breakdown or lack of fast reversibility of the NDR effect for example) are seen. In other words, it is generally desirable to have the charges rapidly trapped and de-trapped at a particular rate that ensures that the device can be put into and out of an NDR mode or operating region quickly, instead of being confined to working within a particular region. Other techniques for increasing the amount of trapped charges, and the trapping/detrapping rates will be apparent to those skilled in the art. For instance, it may not be necessary in fact in some applications, to make the electrons "hot" because they will still be swept by the vertical field into the trapping sites.

Thus, the present invention uses an approach that is in contrast to that of prior art which has charge traps, such as U.S. Pat. No. 5,633,178. In the prior art, the emphasis has been on retaining the charge as long as possible, and this reference for example specifically discloses using a refresh operation to keep the logic state. Accordingly, there is no effort made in the prior art to implement or sustain a dynamic process where charges are continually trapped and de-trapped. In fact conventional disclosures discourage such condition because it has been perceived to date as an undesirable situation, and so this explains, too, why such references do not describe configuring a FET channel to have a structure and doping characteristics that would facilitate this type of trapping/detrapping mechanism.

The drain current and therefore the negative differential resistance in this invention can be adjusted by varying the gate voltage as seen in FIG. 2. As seen also in FIG. 2, the invention can be seen as exploiting the fact that, as the threshold voltage $V_t$ dynamically increases (because of the accumulation of trapped charges) with increasing drain-to-source voltage $V_{DS}$, a drain current $I_{DS}$ (which is proportional to $V_g-V_t$) will first increase, and then begin to decrease as $V_t$ begins to exceed $V_g$ and thus dominate the behavior of the device. Thus, a current value depicted in curve 228 will generally follow the set of continuous curves 229 shown in FIG. 2 for a given $V_g$ and varying $V_t$. The so-called "peak-to-valley ratio," a key figure of merit in NDR devices, can also be tuned in the present invention through suitable combinations of doping concentrations, device geometries and applied voltages.

The present invention bears some resemblance to a leaky (or volatile) floating gate storage device. However, the trapping and de-trapping of electrons in gate insulator 130 of NDR-MISFET 100 are very rapid processes, as compared to the programming and erase processes of a conventional floating-gate non-volatile memory device, so that the threshold voltage of NDR-MISFET 100 can respond dynamically to changes in a gate-to-source voltage and/or a drain-to-source voltage. In fact, while conventional memory devices require extensive pre-programming and erase cycle times to change threshold states, the threshold voltage of the present device responds to the applied source to drain bias voltage with minimal delay. Thus, it can change and reverse a threshold (and thus achieve an NDR mode) in substantially the same time as it takes for device 100 to turn the channel on or off in response to such bias conditions. For any given bias condition (fixed gate-to-source and drain-to-source voltages), a steady-state condition exists in which electrons are continually being rapidly trapped, stored, and de-trapped, maintaining a fixed amount of net charge trapped in gate insulator 130. The fixed amount of net charge trapped in the gate insulator is dependent on the particular voltage bias conditions applied to device 100. As the gate-to-source voltage and/or the drain-to-source voltage changes, the balance of the trapping and de-trapping processes changes, thereby changing the fixed amount of net charge trapped in the gate insulator and dynamically changing the threshold voltage. This means the net NDR effect can be controlled through two different bias parameters, a significant advantage again over conventional two terminal NDR devices. Furthermore, the negative differential resistance characteristic is seen not only as the drain-to-source voltage is increased from zero Volts to a high value (such that hot electrons are trapped in gate insulator 130), but also in the reverse direction as the drain-to-source voltage is decreased from a high value to zero Volts. It is expected, in fact that the threshold voltage variability/reversibility can be tailored to be relatively symmetric, so that it can thus be adjusted from a relatively low voltage value to a relatively high voltage value in approximately the same time required to adjust the threshold voltage from a relatively high voltage value to a relatively low voltage value.

As intimated above, the inventors believe that at higher drain to source voltages another feature of the present invention will be apparent, and that is the relatively high percentage of hot carriers in the channel current. Namely, since hot carriers are generated at a faster rate as the drain to source voltage increases the inventors believe that the net result is that eventually the hot carrier current component of the channel current will become dominant, and thus eventually constitute the only current component in the channel, even if it is extremely small overall. The relative percentage of hot carriers in the channel current, therefore, can be controlled, and this feature of the invention may be beneficial in other application environments.

Another aspect of the invention that is potentially useful is the fact that the trapping sites of the present invention can be thought of as introducing a form of current/charge delay on a single channel basis. The trapping time, temporary storage time, and detrapping time making up such delay can be controlled as a function of the applied horizontal and vertical electrical fields, and this aspect might be exploited in other environments.

As explained herein, the p-type dopant concentration in the surface region of the semiconductor underneath the gate electrode should be relatively high. This is to ensure that the vertical electric field is high (greater than $10^6$ V/cm) when the transistor is turned on, to promote the creation of hot electrons in the channel. A conventional NMOS transistor with channel length less than 250 nm may (in some applications) have such a high channel dopant concentration, but it will not achieve the results of the present invention because this structure alone is insufficient to bring about an NDR effect. In a preferred embodiment, the doping concentration is made slightly graded, so that the concentration of dopant is slightly lower at the semiconductor surface, and then peaks at some relatively small distance (below 30 nm) below the surface. This is done in order to achieve a built-in electric field, which in turn serves to confine electrons near the surface of the semiconductor, and thus further enhances the injection of electrons into the trapping sites in the dielectric. Again, other doping concentrations and techniques can also be employed to induce this same phenomenon.

Furthermore, to minimize the possibility of drain avalanche, a preferred embodiment herein teaches that the drain dopant-concentration profile at the junction with the channel is made to be relatively lightly doped. This not only minimizes the impact ionization current between the drain and the channel, but also has the side benefit of minimizing the capacitance between them. By minimizing the drain junction capacitance to the channel, the overall device switching performance is enhanced and the device thus operates faster. Those skilled in the art will appreciate that there are other ways to enhance the generation of hot electrons in the channel in addition to those described herein, and the present invention is not limited to any particular implementation of the same.

A preferred embodiment also confines the relatively high dopant concentration in the channel to the surface region only, so that the dopant concentration in the channel region is initially low (to confine electrons to the surface region), then increases, and then is made lower away from the surface to achieve the effect of low drain-junction capacitance. As alluded to earlier, the present invention is not limited to any particular doping concentration and profile of the dopant in the channel, because the range of such parameters necessary to bring about the NDR effect will vary from device to device of course, depending on the size, geometry, intended function, etc., of the device, but these details can be gleaned with routine and conventional simulation and testings for any particular application, in the same manner as is done for any other conventional semiconductor device. As explained previously, the high surface dopant concentration in the channel should also be offset from the highest dopant concentration in drain region 150 through the use of lightly doped drain (LDD) structures.

One additional and very desirable feature of the present invention is that the drain voltage at the onset of negative differential resistance can be scaled with the scaling of the CMOS technology. In other words, as the transistor channel length is reduced, the drain voltage required to reach the critical composite electric field in the channel (corresponding to the onset of negative differential resistance) is commensurately reduced. This aspect of the invention ensures that the structures and methods taught herein are guaranteed to have substantial and meaningful future utility in advanced generations of devices and products that are made using smaller geometries, lower bias conditions, etc. than those currently available.

As is evident, a key feature of NDR-MISFET 100 is that charge traps or storage nodes 135 exist in gate insulator 130, very near to (within 1.5 nm of) the semiconductor-insulator interface, so that electrons can be trapped and de-trapped very quickly. The creation and distribution/location of such traps 135 can be accomplished in any number of ways that are compatible with conventional semiconductor processing techniques. For example, traps 135 can consist of defect sites within gate dielectric 130 as shown in FIG. 1, or interfacial traps 135 between two or more layers of a multi-layered gate-insulator stack, or one or more electrically isolated ("floating") conductor or semiconductor electrodes 137 embedded within a gate insulator 130 (made up of two layers 130' and 130" sandwiching the embedded electrode 137) as shown in FIG. 3. The only important consideration is that the carrier trapping sites are configured for trapping carriers that are electrically biased by an electrical control field (i.e., the combined effect of bias conditions resulting from the channel doping, the gate to source voltage, the source to drain voltage) to move from the channel into insulator/dielectric layer 130. This can be done in any number of different concentrations and arrangements within layer 130 so that the channel current can be varied all the way from essentially zero (no conduction) to full conduction in accordance with the-strength of the electrical control field.

In a preferred embodiment of the present invention, Boron atoms incorporated into gate insulator 130 during a thermal oxidation of heavily boron-doped silicon serve to provide defect sites which readily trap charge. Alternative embodiments may employ alternative dopant species such as Indium to form charge traps 135, and the present invention is not limited to any particular dopant species in this regard.

As mentioned, other possible embodiments may employ a multi-layered gate insulator, for example a very thin interfacial layer of silicon dioxide and a thicker layer of a second dielectric material such as silicon nitride, with charge-trapping sites at the dielectric-dielectric interface. Further possible embodiments may incorporate islands of metal, silicon or germanium nanocrystals embedded within gate insulator, or perhaps even a single continuous floating gate electrode (FIG. 3) 137, to trap charge. In fact, the present approach can be taken to an extreme to effectuate a new type of non-volatile floating gate electrode for a flash memory cell. It can be seen that complete non-volatility can be achieved by simply locating the trapping sites sufficiently far away from the interface so that the charge does not leak off after it is put there (using conventional programming techniques). This type of discontinuous floating gate electrode, formed as a multitude of trapping sites distributed in the gate dielectric, may have significant operating advantages over conventional continuous electrode. In particular, in the distributed charge storage sites aspect of the present invention, the trapped charge has less mobility than an electron in a sheet type electrode, and thus the charge storage sites are less likely to leak the stored charge (individually and in the aggregate of course) to the source/drain regions. This in turn means that the charge storage sites can be located closer to the channel, and thus the gate insulating layer can be thinner, the programming voltage and/or current smaller, etc. Other methods and techniques for creating and distributing traps 135 in a fashion suitable for achieving an NDR effect, and any non-volatile effects as shown herein will be apparent to those skilled in the art from the present teachings, and can be further gleaned from the descriptions give n the aforementioned prior art references for creating different types and arrangements of charge traps.

To enhance the electron trapping stemming from the generation of hot electrons in the channel (since it is the primary mechanism responsible for the negative differential resistance characteristic) the present disclosure also teaches a preferred embodiment of an insulator 130 for retaining the trapped charge under high gate-voltage bias. To avoid the loss of trapped electrons to gate electrode 110 via tunneling through gate insulator 130, the latter should have sufficient thickness to prevent or at least substantially reduce such tunneling effects. In a preferred embodiment insulator 130 is silicon dioxide formed by either one of, or a combination of conventional thermal oxidation and deposition techniques. As referred to earlier, to avoid significant loss of trapped charge due to quantum-mechanical tunneling, gate insulator 130 is formed to have a thickness of at least 6 nm. Other implementations of insulator material for layer 130 include Silicon Nitride ($Si_3N_4$), or Silicon Oxynitride ($SiO_xN_y$), or a high-permittivity dielectric (relative permittivity greater than 8). The use of a high-permittivity gate dielectric is advantageous for achieving high areal gate capacitance, which facilitates adequate gate control of the channel potential. Again, the present invention is not restricted to any particular selection of thickness and material for insulator layer 130, and other variations/techniques for achieving a reduction in quantum-mechanical tunnelling known in the art can be used to the extent they are compatible with the present objectives.

For a preferred embodiment of this invention, polycrystalline silicon (poly-Si) is used as the material for gate-electrode 110. Other possible embodiments may utilize alternative gate materials such as polycrystalline silicon-germanium or metals, or any number of other conventional materials.

An exemplary process for fabricating the NDR-MISFET in a conventional CMOS fabrication facility is depicted in FIG. 4. A standard p-type silicon starting substrate 120 is first processed through standard isolation-structure-formation process steps; the surface of substrate 120 is then moderately doped (to ~$5 \times 10^{18}$ $cm^{-3}$) by a shallow Boron implant. Subsequent to this a deposition of silicon dioxide (~6 nm) is done (or thermal oxidation) in a manner so that the Boron becomes incorporated into a gate insulator 130 near the surface of silicon substrate 120. The resultant dopant concentration in the Si channel near the surface is several times lower than it is directly after the implant step above, due to segregation of Boron into gate insulator 130. As noted earlier, the Boron dopant then acts effectively as an electron trap during operation of device 100. In contrast to some of the prior art implantation techniques discussed earlier, the oxidation step appears to incorporate the Boron in a manner that facilitates shallow electron traps, making it easier for charge to move in and out of gate insulator 130.

Next, polycrystalline silicon is deposited and patterned to form gate electrode 110. N-type dopant ions such as Arsenic are subsequently implanted at moderate dose to form the lightly doped source/drain regions self-aligned to gate 110, after which sidewall spacers (not shown) are formed by conformal deposition and anisotropic etching of an insulating layer such as silicon nitride. Deep source/drain contact regions 140 and 150 are then formed by ion implantation of Arsenic or Phosphorus and thermal annealing to activate the dopants. Device fabrication is completed with standard passivation, contact and metallization processes. While not explicitly shown, it is apparent, because only conventional processing is required, that other CMOS devices can be formed in the same mask with the present NDR device 100, so that, for example, memory and logic circuits can be formed at the same time as the present device, and thus integrated directly to form a conventional CMOS circuit having NDR capability. While the above is explained with reference to a CMOS process, it will be appreciated by those skilled in the art that other types of starting semiconductor materials could also be used instead. Suitable and/or optimal processing conditions for achieving the NDR mode in any particular CMOS compatible environment will be easily designed and determined by those skilled in the art through conventional modelling and experimentation techniques.

As a final note it is preferable that during normal operation of device 100 that a body contact ($V_B$) should be electrically biased (e.g. at a fixed potential of 0 Volts, as is typical for n-channel MOSFETs). If body terminal ($V_B$) is not connected (i.e. is "floating") then the NDR behavior is drastically diminished or even eliminated. This is because holes which are generated by hot electrons will accumulate at the channel-to-source junction, forward biasing the junction and effectively reducing the transistor threshold voltage (counteracting the charge-trapping effect of increasing the threshold voltage), if the holes are not allowed to flow out of the channel region through the body contact. Thus, if NDR-MISFET 100 is implemented in a silicon-on-insulator substrate, or in a thin film of polycrystalline silicon, care must be taken to provide a body contact. This aspect of the invention can also be exploited of course for certain applications, where it may be potentially useful to be able to turn on or turn off the NDR mode by connecting or disconnecting (switching) a bias voltage to body terminal $V_B$, respectively.

With the prior art, even if a device exhibiting adequate negative differential resistance can be produced, it is still a daunting task to integrate such a device into a conventional CMOS process. Since the device in this invention is inherently an NMOS structure, integration of this device with conventional logic CMOS devices is straightforward. The illustrative flow in FIG. 4 allows an NDR device process module to be completely de-coupled from a conventional process, to allow for independent optimization of the NDR devices and the CMOS devices. This makes it more straightforward to scale the NDR device in this invention with future generations of CMOS integrated-circuit technology.

It will be apparent to those skilled in the art the aforementioned NDR device can be advantageously employed in both memory and logic applications, and in the types of circuits as described in the prior art above in references [1] through [10], i.e., as a memory device, as part of a logic circuit, a self-latching logic device, an amplifier, an oscillator, power management, and many other environments where its useful characteristics can be exploited.

While this invention has been described with reference to illustrative embodiments, this description is not intended to be construed in a limiting sense. It will be clearly understood by those skilled in the art that foregoing description is merely by way of example and is not a limitation on the scope of the invention, which may be utilized in many types of integrated circuits made with conventional processing technologies. Various modifications and combinations of the illustrative embodiments, as well as other embodiments of the invention, will be apparent to persons skilled in the art upon reference to the description. Such modifications and combinations, of course, may use other features that are already known in lieu of or in addition to what is disclosed herein. It is therefore intended that the appended claims encompass any such modifications or embodiments While such claims have been formulated on the particular embodiments described herein, it should be apparent the scope of the disclosure herein also applies to any novel and non-obvious feature (or combination thereof) disclosed explicitly or implicitly to one of skill in the art; regardless of whether such relates to the claims as provided below, and whether or not it solves and/or mitigates all of the same technical problems described above. Finally, the applicants further reserve the right to pursue new and/or additional claims directed to any such novel and non-obvious features during the prosecution of the present application (and/or any related applications).

What is claimed is:

1. A semiconductor structure comprising:
   a trapping layer located proximate to a transistor channel, which transistor channel is capable of carrying a current that varies continuously from a first current value associated with a conducting condition for said transistor channel, to a second current value associated with a non-conducting condition for said transistor channel, said second current value being substantially less than said first current value; and
   a plurality of carrier trapping sites located within said trapping layer, said carrier trapping sites being configured for trapping carriers that are electrically biased by an electrical control field to move from said transistor channel into said trapping layer;
   wherein said trapping sites have a concentration and arrangement within said trapping layer so that a density of carriers in said transistor channel available for carrying said current is increased or decreased by correspondingly dynamically increasing or decreasing a number of carriers stored by said trapping sites.

2. The structure of claim 1, wherein said transistor channel exhibits negative differential resistance.

3. The structure of claim 2, wherein conduction in said transistor channel can be continuously and dynamically varied between a negative differential resistance mode and a non-negative differential resistance mode.

4. The structure of claim 1, wherein said trapping sites are configured such that said carriers are trapped only temporarily and such that a continuous trapping and de-trapping mechanism is set up between said dielectric layer and said transistor channel.

5. A semiconductor device exhibiting negative differential resistance and having a first terminal and a second terminal for applying a bias voltage to a first conductive region and a second conductive region respectively of the semiconductor device, and a third terminal for applying a control voltage to a gate for the semiconductor device, the device comprising:
   a dielectric layer located under the gate, said dielectric layer including trapping sites for trapping carriers flowing in a current between the first conductive region and the second conductive region, said trapping sites having a concentration and distribution in said dielectric layer so as to restrict a variable number of carriers based on the bias voltage and/or control voltage;
   wherein said trapping sites permit the semiconductor device to be operable in a negative differential resistance range by increasing said variable number of carriers restricted from flowing in said current as said bias voltage is increased.

6. The device of claim 5, wherein said carriers are hot electrons generated in a channel coupling the first conductive region and the second conductive region.

7. The device of claim 5, wherein electrons are confined in a region near said dielectric layer by a varying dopant concentration in a channel region located under said dielectric layer and between the first conductive region and the second conductive region.

8. A semiconductor device having a control gate, a source region, a drain region and further comprising:
   a channel for carrying a device current between the source and drain regions; and
   a dielectric layer located proximate to said channel, said dielectric layer including trapping sites for trapping electrons from said channel, said trapping sites being configured with a concentration and distribution so as to restrict said device current; and
   wherein said device current can be restricted by said trapping sites so as to operate said semiconductor device in a negative differential resistance mode.

9. A semiconductor transistor device comprising:
   a source region coupled to a first terminal for receiving a source bias signal; and
   a drain region coupled to a second terminal for receiving a drain bias signal, and being connected by a channel of the semiconductor transistor device to said source region; and a gate coupled to a third terminal for receiving a gate control signal; and a dielectric layer located proximate to said gate, said dielectric layer being configured to trap and rapidly de-trap a number of carriers flowing in said channel;

wherein said number of carriers that can be trapped in said dielectric layer can be instantly and reversibly controlled by adjusting said source bias signal, said drain bias signal, and/or said gate control signal.

10. The device of claim 9, wherein said semiconductor transistor device constitutes a three terminal device that can be operated in a range that exhibits negative differential resistance.

11. A semiconductor device located within a substrate and having a control gate, a source region, a drain region and further comprising:

a channel located in a surface of the substrate for carrying a source-drain current, said channel being configured so that carriers for said source-drain current in said channel can be subjected to an electrical field resulting from a bias voltage applied to the source and drain regions, and a control voltage applied to the control gate;

a trapping layer located close to said channel for temporarily storing carriers that acquire sufficient energy from said electrical field to overcome an interface barrier between the channel and the trapping layer;

wherein in a first operating region for the semiconductor device said source-drain current has a value that increases as said electrical field increases; and further wherein in a second operating region for the semiconductor device said source-drain current has a value that decreases as said electrical field increases.

12. A semiconductor device located within a substrate and having a control gate, a source region, a drain region and further comprising:

a channel located in a surface of the substrate for carrying a source-drain current, said channel being configured so that carriers for said source-drain current in said channel can be subjected to an electrical field having a first field component along said surface resulting from a bias voltage applied to the source and drain regions, and a second field component substantially perpendicular to said surface resulting from a control voltage applied to the control gate;

a trapping layer located close to said channel for temporarily storing carriers that:
(i) acquire sufficient energy from said first field component to overcome an interface barrier between the channel and the trapping layer; (ii) and are forced into said trapping layer by said second field component;

wherein a field generated by said carriers stored in said trapping layer can be adjusted to be sufficiently large so as to cause said channel to be depleted of carriers and so that the device can be operated in a negative differential resistance mode.

13. A semiconductor transistor device comprising:

a source region; and a drain region;

a channel region coupled between said source and drain regions, said channel region being configured such that when a bias signal is applied between said source and drain regions, hot carriers are generated substantially uniformly throughout a length of said channel region;

a gate adapted for receiving a gate control signal; and a dielectric layer located proximate to said gate and said channel region, said dielectric layer being configured to trap a number of said hot carriers flowing in said channel;

wherein said number of hot carriers that can be trapped in said dielectric layer can be controlled by adjusting said bias signal and/or said gate control signal so that the semiconductor transistor can exhibit negative differential resistance.

14. A metal-insulator-semiconductor field-effect transistor (MISFET) exhibiting negative differential resistance comprising:

first conductivity type doped source and drain regions formed in the surface of a semiconductor substrate and separated by a second conductivity type doped channel region, said second conductivity type being opposite to said first conductivity;

a gate formed over and electrically insulated from said channel region by a gate dielectric;

said gate dielectric including one or more charge trapping sites configured to allow a transistor threshold voltage of the MISFET to be significantly altered in a dynamic and reversible manner.

15. The MISFET of claim 14 wherein said semiconductor substrate includes second conductivity type doped silicon.

16. The MISFET of claim 14 wherein said semiconductor substrate includes second conductivity type doped silicon-germanium.

17. The MISFET of claim 14 wherein said second conductivity type doped channel region has a dopant concentration near said semiconductor channel surface that is sufficiently high such as to cause hot electrons to be generated in the channel when the transistor is turned on and the drain-to-source voltage is sufficiently biased.

18. The MISFET of claim 14 wherein said second conductivity type doped channel region is offset from said source and drain regions to minimize junction capacitance.

19. The MISFET of claim 14 wherein said negative differential resistance is not based on a band-to-band tunneling mechanism.

20. The MISFET of claim 14 wherein said negative differential resistance is primarily caused by rapid trapping and de-trapping of electrons to and from said charge trapping sites in said gate dielectric.

21. The MISFET of claim 14 wherein said charge trapping sites in said gate dielectric serve to trap electrons, causing said MISFET threshold voltage to increase dynamically and thereby reducing an output current of the MISFET as a drain-to-source voltage difference is increased.

22. The MISFET of claim 21 wherein electron trapping and detrapping occurs primarily in said gate dielectric above said second conductivity type doped channel region and is minimized above a depletion region of a drain junction of the MISFET.

23. The MISFET of claim 14 wherein said gate dielectric includes one or more of the following materials: silicon-dioxide, silicon-nitride, and/or silicon-oxynitride, and/or a high-permittivity layer with a relative permittivity greater than approximately eight (8).

24. The MISFET of claim 14 wherein said gate dielectric is silicon-dioxide formed either entirely or partially by thermal oxidation of heavily doped ($>10^{18}$ cm$^{-3}$) p-type silicon.

25. The MISFET of claim 24 wherein said charge trapping sites consist of defects within said silicon-dioxide formed by thermal oxidation of said doped p-type silicon.

26. The MISFET of claim 23, wherein said charge trapping sites consist of defects within said gate dielectric.

27. The MISFET of claim 23 wherein said gate dielectric consists of a plurality of dielectric layers.

28. The MISFET of claim 27 wherein said charge trapping sites consist of defects located near an interface between adjacent layers of said gate dielectric.

29. The MISFET of claim 23 wherein the charge-trapping sites consist of one or more islands of metal or semiconductor embedded in said gate dielectric.

30. The MISFET of claim 23 wherein a substantially non-volatile charge-storage site consisting of a floating electrode is embedded within said gate dielectric.

31. The MISFET of claim 27 wherein said charge-trapping sites consist of one or more islands of metal or semiconductor located in one or more of said plurality of dielectric layers.

32. The MISFET of claim 27 wherein a substantially non-volatile charge-storage site consisting of a floating electrode is located in one or more of said plurality of dielectric layers.

33. The MISFET of claim 23 wherein the gate dielectric has a thickness adapted to minimize loss of trapped charge due to quantum-mechanical tunneling.

34. The MISFET of claim 14 wherein said gate includes one or more of the following: metal, polycrystalline silicon and/or polycrystalline silicon-germanium.

35. The MISFET of claim 14 wherein a drain dopant concentration profile is tailored to minimize impact ionization current between said first conductivity type drain region and said second conductivity type doped channel region.

36. The MISFET of claim 14 wherein a drain dopant concentration profile is tailored to minimize junction capacitance between said first conductivity type drain region and said semiconductor substrate.

37. The MISFET of claim 14 wherein a substrate doping profile is tailored to minimize junction capacitance between said first conductivity type drain region and said semiconductor substrate.

38. A method of operating a semiconductor device comprising the steps of:
  (a) providing a current in a channel that varies continuously from a first current value associated with a conducting condition, to a second current value associated with a non-conducting condition for said channel, said second current value being substantially less than said first current value;
  (b) providing a plurality of carrier trapping sites, said carrier trapping sites being configured for trapping carriers that are electrically biased by an electrical control field to move from said channel into said carrier trapping sites;
  (c) dynamically increasing or decreasing a number of carriers stored by said trapping sites using said electrical control field so that a density of carriers in said transistor channel available for carrying said current is also correspondingly increased or decreased.

39. The method of claim 38, wherein said device can be operated in a negative differential resistance mode.

40. The method of claim 39, wherein conduction in said transistor channel can be continuously and dynamically varied between a negative differential resistance mode and a non-negative differential resistance mode.

41. A method of operating a semiconductor device having a first terminal and a second terminal for applying a bias voltage to a first conductive region and a second conductive region respectively of the semiconductor device, and a third terminal for applying a control voltage to a gate for the semiconductor device, the method comprising the steps of:
  (a) providing a dielectric layer located under the gate, said dielectric layer including trapping sites for trapping carriers flowing in a current between the first conductive region and the second conductive region;
  (b) arranging said trapping sites to have a concentration and distribution in said dielectric layer so as to restrict a variable number of carriers based on the bias voltage and/or control voltage;
  wherein said trapping sites permit the semiconductor device to be operable in a negative differential resistance range by increasing said variable number of carriers restricted from flowing in said current as said bias voltage is increased.

42. A method of operating a transistor device comprising the steps of:
  (a) receiving a bias signal across a channel region of the semiconductor device, said channel region being coupled to a source and a drain region;
  (b) receiving a gate control signal at a gate of the transistor device; and
  (c) configuring a dielectric layer located proximate to said gate to trap and rapidly de-trap a number of carriers flowing in said channel;
  wherein said number of carriers that can be trapped in said dielectric layer can be instantly and reversibly controlled by adjusting said bias signal and/or said gate control signal.

43. A method of operating a semiconductor device located within a substrate and having a control gate, a source region, a drain region, and a channel region coupling the source and drain region, and including the steps of:
  (a) configuring the channel so that carriers for a source-drain current in the channel can be subjected to an electrical field resulting from a bias voltage applied to the source and drain regions, and a control voltage applied to the control gate;
  (b) temporarily storing carriers in a trapping layer, which carriers are electrons that have acquired sufficient energy from said electrical field to overcome an interface barrier between the channel and said trapping layer;
  wherein the semiconductor device operates in a first region where said source-drain current has a value that increases as said electrical field increases; and
  further wherein the semiconductor device operates in a second operating region where said source-drain current has a value that decreases as said electrical field increases.

44. A method of operating a metal-insulator-semiconductor field-effect transistor (MISFET) comprising the steps of:
  (a) providing a source-drain current of carriers in a channel region located between a source region and a drain region;
  (b) providing a gate over and electrically insulated from said channel region by a gate dielectric;
  (c) providing one or more charge trapping sites in the gate dielectric, which trapping sites are configured to allow a transistor threshold voltage of the MISFET to be significantly altered in a dynamic and reversible manner by continuously trapping and de-trapping a number of carriers of said source-drain current.

45. A semiconductor transistor device with a threshold voltage that can be controlled comprising:

a source region; and a drain region that is connected by a channel of the semiconductor transistor device to said source region; and said source and drain region being coupled to receive a source-drain bias signal;

a gate configured for receiving a gate control signal; and a trapping layer located between said gate and said channel, said trapping layer being configured to continuously and rapidly trap and de-trap charge carriers in response to said source-drain bias signal so as to accumulate a net charge;

wherein a value of the threshold voltage of the semiconductor device is determined by said net charge influencing a density of carriers in said channel;

further wherein said source region, said drain region, said gate and said dielectric layer are electrically coupled so that said net charge and the threshold voltage can be controlled by adjusting said source-drain bias signal.

46. The semiconductor transistor device of claim 45, wherein said charge carriers are trapped and de-trapped substantially uniformly along an interface between said channel and said trapping layer.

47. The semiconductor transistor device of claim 45, wherein said charge carriers are hot electrons originating from said channel and caused by said source-drain bias signal.

48. The semiconductor transistor device of claim 45, wherein said channel is doped to be of opposite conductivity type to said source and drain regions such that a vertical electric field is created to attract said charge carriers to said trapping layer.

49. The semiconductor transistor device of claim 48, wherein injection of hot holes into said gate is minimized by action of said vertical electric field.

50. The semiconductor transistor device of claim 45, wherein said threshold voltage is reversible so that it can be dynamically increased by increasing said net charge, and/or dynamically decreased by decreasing said net charge.

51. A semiconductor transistor device comprising:

a channel coupling a source region and a drain region, said channel being capable of carrying a current between said source region and said drain region;

a gate for providing a conduction control signal to control said current in said channel;

a trapping layer located proximate to said channel, said trapping layer including a plurality of carrier trapping sites, said carrier trapping sites being configured for rapidly trapping hot carriers that are part of said current in said channel, and said carrier trapping sites being further configured for rapidly de-trapping said hot carriers;

wherein a trapping rate and de-trapping rate of said hot carriers can be controlled to store a predetermined amount of charge in said trapping layer;

further wherein said channel region, said source region, said drain region, said gate and said trapping layer are electrically coupled so that a threshold voltage of the semiconductor device can be controlled by adjusting said predetermined amount of charge, and such that:

said threshold voltage increases as said predetermined amount of charge increases;

said threshold voltage decrease as said predetermined amount of charge decreases;

and further wherein said threshold voltage can be increased or decreased at approximately the same rate.

52. The semiconductor transistor device of claim 51, wherein said trapping layer is further configured to include traps used to store charge for a memory cell.

53. The semiconductor transistor device of claim 51, wherein said hot carriers are hot electrons, and further wherein injection of hot holes to said trapping layer is minimized by providing a vertical electric field in said channel region.

54. The semiconductor transistor device of claim 51 wherein said trapping and detrapping of said hot carriers occurs substantially uniformly throughout a length of said channel region.

55. The semiconductor transistor device of claim 51 wherein said channel region is heavily doped with a dopant of an opposite conductivity to said source region and said drain region.

56. A method of controlling a threshold voltage for a transistor device comprising the steps of:

coupling a bias signal to a source region and drain region of the transistor device;

coupling a gate control signal to a gate of the transistor device; and continuously trapping and de-trapping charge carriers from a channel of the transistor device generated by the bias signal so as to accumulate a net charge in a trapping layer associated with the transistor device;

altering a value of the threshold voltage of the semiconductor device by using said net charge to influence a density of carriers in said channel;

wherein said net charge and the threshold voltage can be controlled by adjusting said bias signal.

57. The method of claim 56, wherein said charge carriers are trapped and de-trapped substantially uniformly along an interface between said channel and said trapping layer.

58. The method of claim 56, wherein said charge carriers are hot electrons.

59. The method of claim 56, further including a step of generating a vertical electric field in said channel to attract said charge carriers to said trapping layer.

60. The method of claim 56, wherein said threshold voltage is reversible so that it can be dynamically increased by increasing said net charge, and/or dynamically decreased by decreasing said net charge.

61. A method of controlling a threshold voltage of a transistor, comprising the steps of:

providing a control signal to a gate of the transistor to selectively enable current conduction in a channel of the transistor; and providing a bias signal across said channel to generate hot carriers in a substantially uniform manner throughout said channel; and adjusting a density of carriers available in said channel for said current conduction by trapping and de-trapping said hot carriers within a trapping region to accumulate a net charge at a rate determined by said bias signal;

wherein through said step of adjusting said density of carriers, said threshold voltage increases when said bias signal increases, and said threshold voltage decreases when said bias signal decreases;

further wherein said threshold voltage is adjustable from a low value to a high value in substantially the same time as that required to be adjusted from said high value to said low value.

62. The method of claim 61, further including a step of providing a vertical field in said channel to promote movement of said hot carriers into said trapping region.

63. The method of claim 61, wherein a gate to drain voltage is lower than said threshold voltage so that a drain current saturates due to velocity saturation and not pinch-off during operation of the transistor.

64. The method of claim 61 wherein said trapping region is further configured to store charge for a memory cell.

65. The method of claim 61, further including a step of biasing a body region of the transistor so as to remove holes generated by hot electrons comprising said hot carriers.

* * * * *